US011437383B1

(12) United States Patent
Wang et al.

(10) Patent No.: US 11,437,383 B1
(45) Date of Patent: Sep. 6, 2022

(54) METHOD FOR FABRICATING DYNAMIC RANDOM ACCESS MEMORY DEVICES

(71) Applicant: NANYA TECHNOLOGY CORPORATION, New Taipei (TW)

(72) Inventors: Mao-Ying Wang, New Taipei (TW); Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/337,061

(22) Filed: Jun. 2, 2021

(51) Int. Cl.
*H01L 21/00* (2006.01)
*H01L 27/108* (2006.01)
*H01L 49/02* (2006.01)

(52) U.S. Cl.
CPC .. *H01L 27/10852* (2013.01); *H01L 27/10808* (2013.01); *H01L 28/91* (2013.01)

(58) Field of Classification Search
CPC ......... H01L 27/10852; H01L 27/10808; H01L 28/91
See application file for complete search history.

(56) References Cited

U.S. PATENT DOCUMENTS

| 2015/0171088 | A1* | 6/2015 | Hung | H01L 27/10817 438/397 |
| 2016/0358998 | A1* | 12/2016 | Lim | H01L 27/10891 |
| 2017/0018604 | A1* | 1/2017 | Ahn | H01L 28/40 |
| 2021/0408002 | A1* | 12/2021 | LaJoie | H01L 28/90 |

* cited by examiner

*Primary Examiner* — Richard A Booth
(74) *Attorney, Agent, or Firm* — Muncy, Geissler, Olds & Lowe, P.C.

(57) ABSTRACT

The present disclosure provides a method for fabricating DRAM devices with cylinder-type stacked capacitors. By utilizing offsetting of a first lattice pattern on a second silicon nitride layer (i.e., a middle silicon nitride layer) and a second lattice pattern on a third silicon nitride layer (i.e., a top silicon nitride layer), a collapse or deformation phenomenon of bottom electrodes of stacked capacitors can be reduced or eliminated. The wobbling phenomenon of bottom electrodes of stacked capacitors can be significantly reduced.

14 Claims, 11 Drawing Sheets

METHOD FOR FABRICATING DYNAMIC RANDOM ACCESS MEMORY DEVICES

TECHNICAL FIELD

The present disclosure generally relates to the field of dynamic random-access memory (DRAM) devices, and more particularly, to a method for fabricating DRAM devices with cylinder-type stacked capacitors.

DISCUSSION OF THE BACKGROUND

With current trends toward miniaturization of various electronic products, design of DRAM components must also meet requirements of high integration and high density. A DRAM circuit consists of an array of individual memory cells, each cell consisting of a single access transistor, which is usually a field-effect transistor (FET), and a single storage capacitor. In recent years, capacitors with 3-dimensional structures, such as trench capacitors and stacked capacitors, are widely used in the industry, and can effectively reduce sizes of memory cells and more effectively utilize chip space to create high-density DRAM structures.

There are various stacking types for stacked capacitors, such as planar-type, pillar-type, fin-type, cylinder-type and so on. In a capacitor, the capacitance is directly proportional to both the surface area of the electrodes and the dielectric constant of the dielectric film. Since both outer and inner surfaces can be utilized as effective capacitor area, the cylinder structure is suitable for the three-dimensional stacked capacitor, and is more particularly suitable for an integrated memory cell with a capacity of 64 MB or greater. Also, an improved stacked capacitor has been presented, where pillars or another inner cylinder is formed in the interior of the cylinder. While both the inner and outer surfaces of the cylinder may be utilized as effective capacitor area, the outer surface of the pillars or the inner cylinder formed in the interior of the cylinder may also be used.

Typically, fabrication of a 3-dimensional cylinder-type stacked capacitor starts with formation of a capacitor pattern, followed by dry etching of a capacitor oxide film to form a trench, within which a storage electrode is constructed. Next, the capacitor oxide film is removed by a wet etching process using a wet chemical including hydrofluoric acid or ammonium fluoride. In the past, no problems were found in this wet etching process when the aspect ratio of the capacitor was low. Nowadays, an aspect ratio at least 20:1 or greater has become common in advanced semiconductor manufacturing. As aspect ratios have been increased, manufacture of stacked capacitors encounters a problem wherein a bottom electrode tends to collapse or deform, which leads to wobbling of the bottom electrode.

One existing method for addressing the problem of collapse or deformation of stacked capacitors comprises forming aligned lattice patterns in a middle silicon nitride layer and a top silicon nitride layer of the stacked capacitors. In this method, sizes of the lattice patterns in the middle silicon nitride layer are reduced, which impacts capacitance. The stacked capacitors obtained from this method suffer from insufficient capacitance.

There is therefore a need for a method by which the collapse or deformation of stacked capacitors can be solved.

This Discussion of the Background section is provided for background information only. The statements in this Discussion of the Background are not an admission that the subject matter disclosed in this section constitutes prior art with respect to the present disclosure, and no part of this Discussion of the Background section may be used as an admission that any part of this application, including this Discussion of the Background section, constitutes prior art with respect to the present disclosure.

SUMMARY

To meet the foregoing need, and in accordance with the purpose of the present disclosure, a method for fabricating DRAM devices with cylinder-type capacitor bottom electrodes is provided. The method can be generally characterized as comprising the following steps: providing a semiconductor substrate having a plurality of contact regions; sequentially depositing a first silicon nitride layer, a first silicon oxide layer and a second silicon nitride layer on the semiconductor substrate; patterning the second silicon nitride layer using a first photomask to form a first lattice pattern having a periphery on the second silicon nitride layer, thereby revealing the underlying portion of the first silicon oxide layer; sequentially depositing a second silicon oxide layer and a third silicon nitride layer on the second silicon nitride layer; forming a plurality of vias having sidewalls and bottoms vertically through the third silicon nitride layer, the second silicon oxide layer, the second silicon nitride layer, the first silicon oxide layer, and the first silicon nitride layer using a second photomask, thereby revealing the underlying portion of the contact regions, wherein the vias overlap the periphery of the first lattice pattern; coating the sidewalls and the bottoms of the vias with a first titanium nitride layer; depositing a hard mask on the third silicon nitride layer, thereby sealing the vias; forming a second lattice pattern having a periphery on the hard mask using the first photomask, thereby revealing the underlying portion of the second silicon oxide layer, wherein the second lattice pattern is offset from the first lattice pattern at a distance of one or more vias, and wherein the vias overlap the periphery of the first lattice pattern and the second lattice pattern; depositing a high-k dielectric layer over the third silicon nitride layer; and anisotropically etching the high-k dielectric layer and the third silicon nitride layer until the underlying portion of the second silicon oxide layer is revealed, and continuing said etching until both of the first silicon oxide layer and the second silicon oxide layer are removed.

In some embodiments, the step of sequentially depositing a first silicon nitride layer, a first silicon oxide layer and a second silicon nitride layer on the semiconductor substrate is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), or plasma enhanced chemical vapor deposition (PECVD), or a combination thereof.

In some embodiments, the step of patterning the second silicon nitride layer using a first photomask to form a first lattice pattern having a periphery on the second silicon nitride layer is performed by anisotropic plasma etching.

In some embodiments, the step of sequentially depositing a second silicon oxide layer and a third silicon nitride layer on the second silicon nitride layer is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof.

In some embodiments, the step of forming a plurality of vias having sidewalls and bottoms vertically through the third silicon nitride layer, the second silicon oxide layer, the second silicon nitride layer, the first silicon oxide layer, and the first silicon nitride layer using a second photomask is performed by dry anisotropic etching using a fluorine-containing compound as an etchant.

In some embodiments, the fluorine-containing compound is selected from a group consisting of trifluoromethane, tetrafluoromethane, and sulfur hexafluoride.

In some embodiments, the step of coating the sidewalls and the bottoms of the vias with a first titanium nitride layer is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof.

In some embodiments, the step of depositing a hard mask on the third silicon nitride layer is performed by plasma enhanced chemical vapor deposition (PECVD).

In some embodiments, the step of forming a second lattice pattern having a periphery on the hard mask using the first photomask is performed by anisotropic plasma etching.

In some embodiments, the step of depositing a high-k dielectric layer over the third silicon nitride layer is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof.

In some embodiments, the step of anisotropically etching the high-k dielectric layer and the third silicon nitride layer until the underlying portion of the second silicon oxide layer is performed by using a hot phosphoric acid solution.

In some embodiments, the first lattice pattern and the second lattice pattern have an annular shape or a polygonal shape.

In some embodiments, the first lattice pattern and the second lattice pattern have a polygonal shape selected from a triangle shape and a quadrangle shape.

In some embodiments, the first lattice pattern and the second lattice pattern have a quadrangle shape selected from a group consisting of a rectangle shape, a trapezoid shape, and a parallelogram shape.

In the present disclosure, by allowing the second lattice pattern on the third silicon nitride layer (i.e., a top silicon nitride layer) to be offset from the first lattice pattern on the second silicon nitride layer (i.e., a middle silicon nitride layer) at a distance of one or more vias, the lower portion of a cylinder-type capacitor bottom electrode is guided by the first lattice pattern in the middle silicon nitride layer in one direction, and the upper portion of the same cylinder-type capacitor bottom electrode is guided by the second lattice pattern in the top silicon nitride layer in in an opposite direction. Therefore, the collapse or deformation phenomenon of bottom electrodes of stacked capacitors is reduced or eliminated. The wobbling phenomenon of bottom electrodes of stacked capacitors can be significantly reduced.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
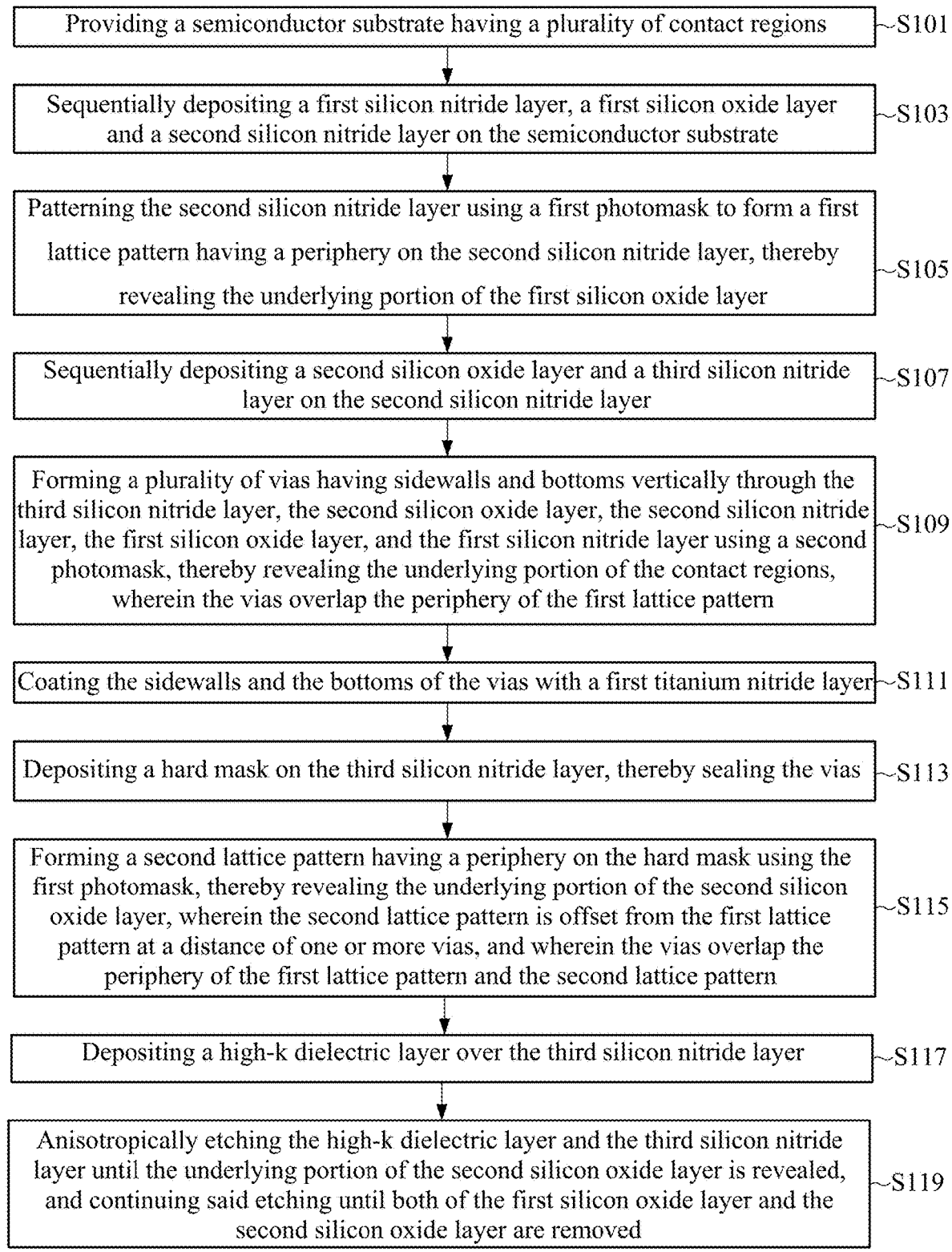
FIG. 1 is a representative flow diagram illustrating a method for fabricating DRAM devices with cylinder-type capacitor bottom electrodes according to an embodiment of the present disclosure.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, descriptions of many conventional steps will be provided only briefly herein or will be omitted entirely without providing the well-known process details.

Embodiments (or examples) of the disclosure illustrated in the drawings are now described using specific language. It shall be understood that no limitation to the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "pattern" and "patterning" are used in the present disclosure to describe an operation of forming a predetermined pattern on a surface. The patterning operation includes various steps and processes and varies in accordance with different embodiments. In some embodiments, a patterning process is adopted to pattern an existing film or layer. In some embodiments, the patterning process includes forming a mask on the existing film or layer and removing the unmasked film or layer with an etching or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

In advanced manufacturing technology, process windows require attention to more concerns. The array region and the peripheral region in a DRAM cell have different pattern densities and serve different functions after a production process of the DRAM cell is completed. Therefore, the process windows of the array region and the peripheral region vary significantly. Normally, their respective circuit patterns may not be formed at the same time.

The present disclosure will be described in detail with reference to the accompanying drawings with numbered elements. It should be noted that the drawings are in greatly simplified form and are not drawn to scale. Moreover; dimensions have been exaggerated in order to provide a clear illustration and understanding of the present invention.

FIG. 1 is a representative flow diagram of a method 10 for fabricating DRAM devices with cylinder-type capacitor bottom electrodes according to an embodiment of the present disclosure. FIGS. 2, 3, 4A, 4B, 4C, 5, 6A, 6B, 6C, 7A, 7B, 8, 9A, 9B, 10, and 11 are illustrative top views, cross-sectional views, three-dimensional cross-sectional views or three-dimensional views showing a semiconductor structure after steps of the method are performed in accordance with some embodiments of the present disclosure.

Figure 2:
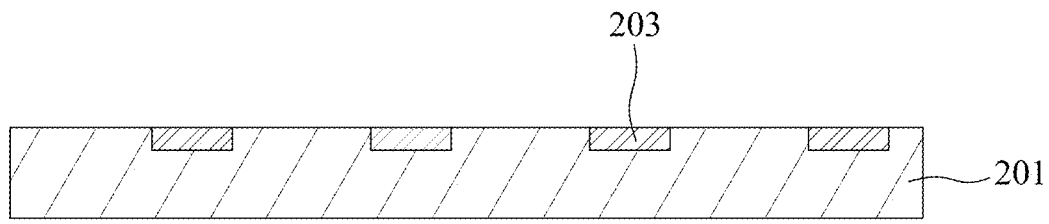
FIG. 2 is a cross-sectional view showing a semiconductor structure according to an embodiment of the present disclosure after performing of step S101 in FIG. 1.

Referring to FIGS. 1 and 2, a semiconductor substrate 201 having a plurality of contact regions 203 is provided in step S101. In the present disclosure, the term "substrate" means and includes a base material or construction upon which materials are formed. It will be appreciated that the substrate may include a single material, a plurality of layers of different materials, a layer or layers having regions of different materials or different structures in them, or another similar arrangement. These materials may include semiconductors, insulators, conductors, or combinations thereof. For example, the semiconductor substrate 201 may be a semiconductor substrate, a base semiconductor layer on a supporting structure, a metal electrode, or a semiconductor substrate having one or more layers, structures or regions formed thereon. The semiconductor substrate 201 may be a conventional silicon substrate or other bulk substrate including a layer of semiconductive material. In some embodiments, the semiconductor substrate 201 may be a silicon (Si) substrate, a germanium (Ge) substrate, a silicon germanium (SiGe) substrate, a silicon-on-sapphire (SOS) substrate, a silicon-on-quartz substrate, a silicon-on-insulator (SOI) substrate, a III-V compound semiconductor, a combination thereof, or the like.

Figure 3:
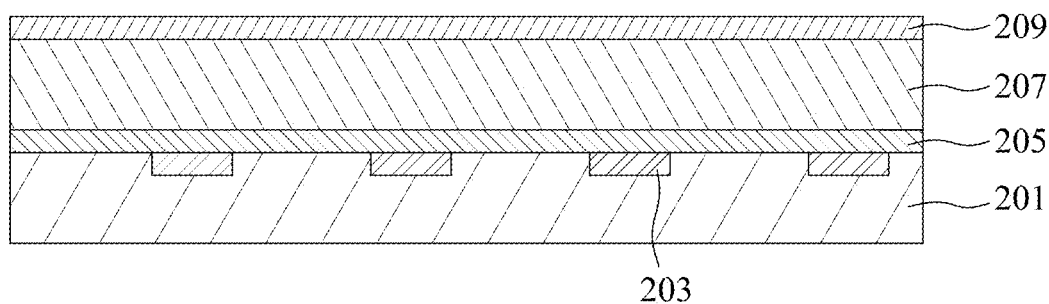
FIG. 3 is a cross-sectional view showing the semiconductor structure according to an embodiment of the present disclosure after performing of step S103 in FIG. 1.
Figure 4A:
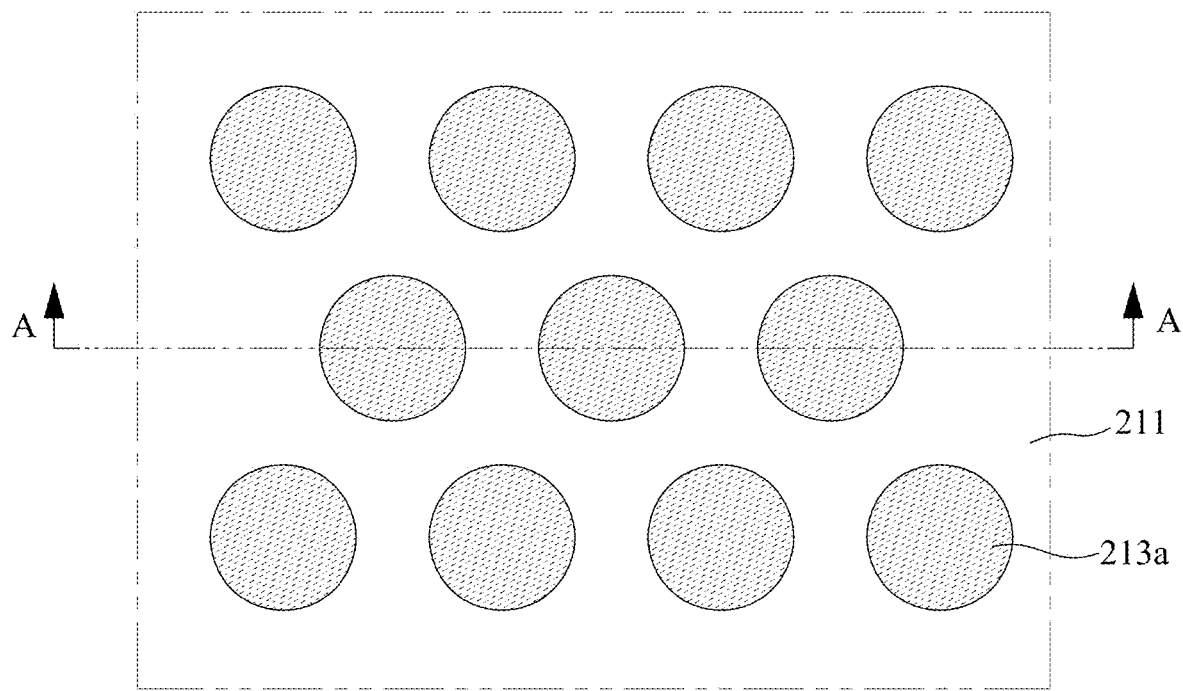
FIG. 4A is an illustrative top view showing the semiconductor substrate according to an embodiment of the present disclosure during an intermediate stage of performing of step S105 in FIG. 1 using a first photomask.
Figure 4B:
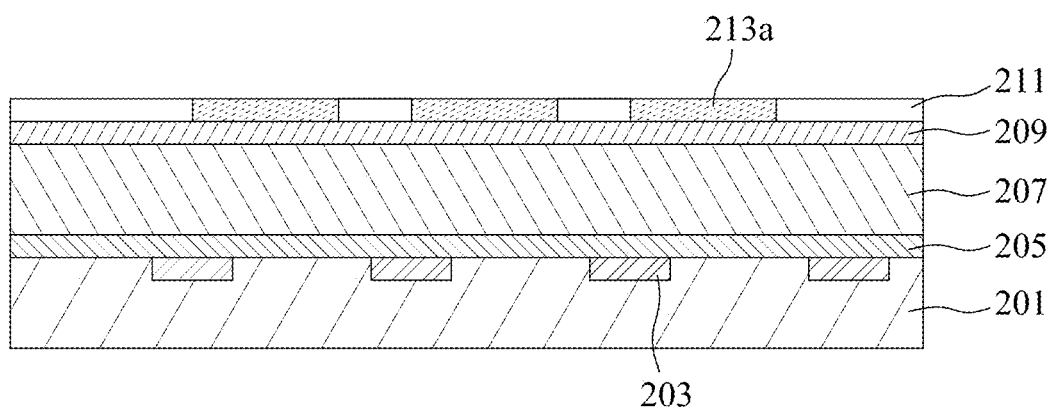
FIG. 4B is a cross-sectional view, taken along line A-A in FIG. 4A, of the semiconductor substrate according to an embodiment of the present disclosure during an intermediate stage of the performing of step S105 in FIG. 1 using a first photomask.
Figure 4C:
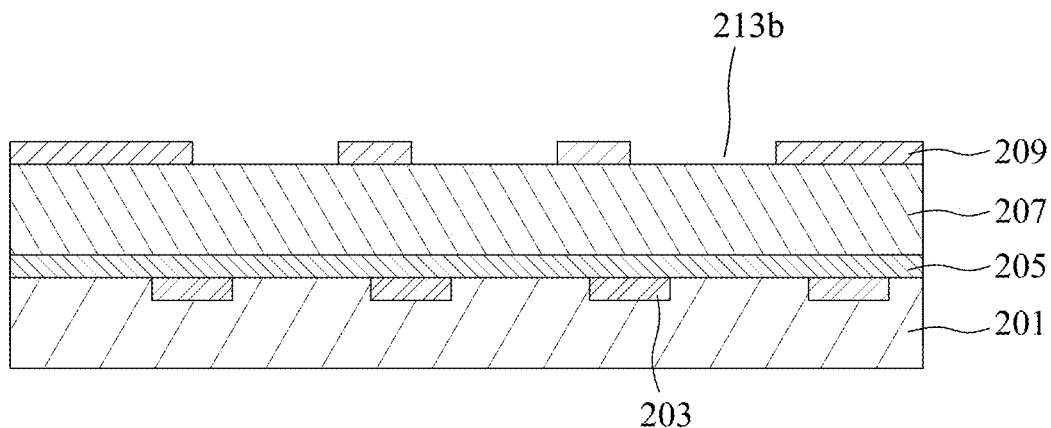
FIG. 4C is a cross-sectional view of the semiconductor substrate according to an embodiment of the present disclosure after the performing of step S105 in FIG. 1.

Referring to FIGS. 1 and 3, in step S103, a first silicon oxide layer 205, a first silicon nitride layer 207 and a second silicon oxide layer 209 are sequentially deposited on the semiconductor substrate 201. A process such as spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof can be used for the performing of step S103.

Referring to FIGS. 1, 4A, 4B, and 4C, in step S105, a first photomask 211 and an anisotropic plasma etching are used to perform the patterning of the second silicon nitride layer 209 to form a first lattice pattern 213a on the second silicon nitride layer 209, and the etching is continued until the portion of the second silicon nitride layer 209 within the first lattice pattern 213a is removed and the underlying portion of the first silicon oxide layer 207 is revealed. Accordingly, a recess 213b corresponding to the first lattice pattern 213a of the first photomask 211 is formed in the second silicon nitride layer 209.

Figure 5:
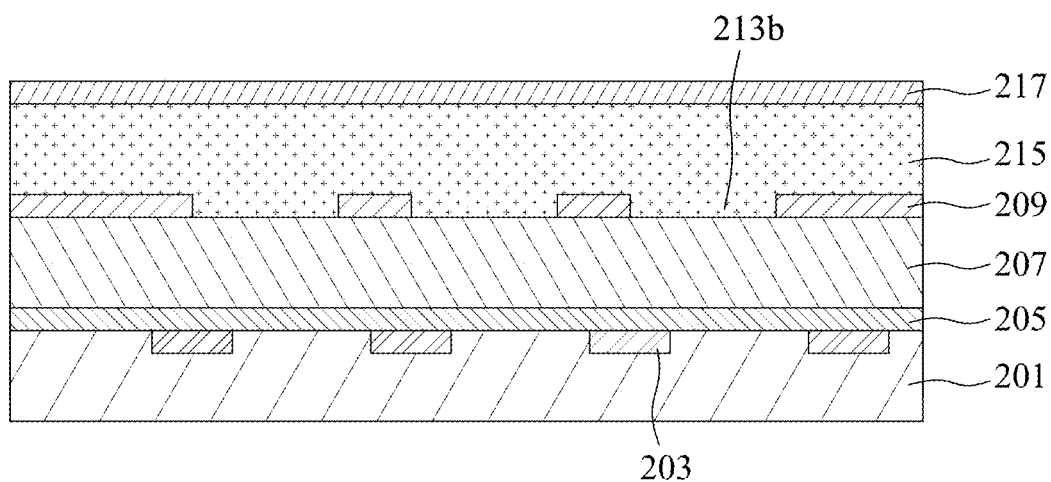
FIG. 5 is a cross-sectional view showing the semiconductor structure according to an embodiment of the present disclosure after performing of step S107 in FIG. 1.
Figure 6A:
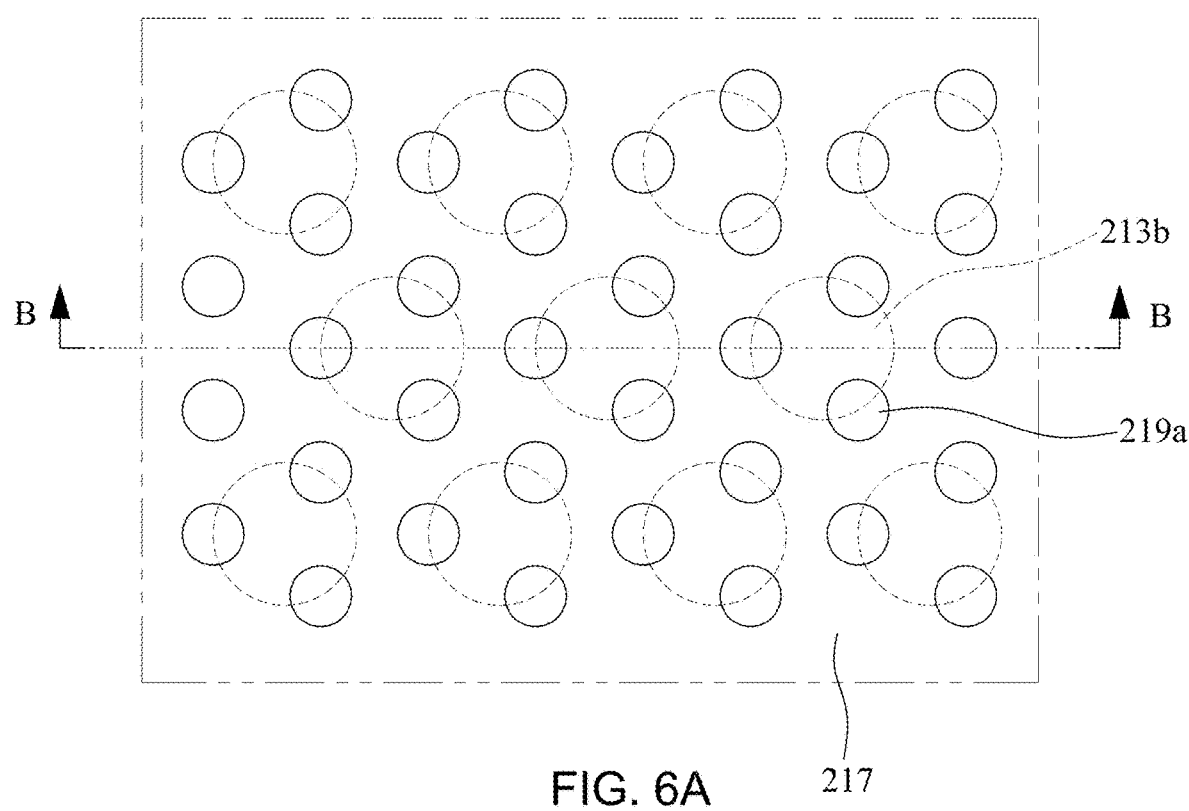
FIG. 6A is a top view showing the semiconductor substrate according to an embodiment of the present disclosure after performing of step S109 in FIG. 1 using a second photomask.
Figure 6B:
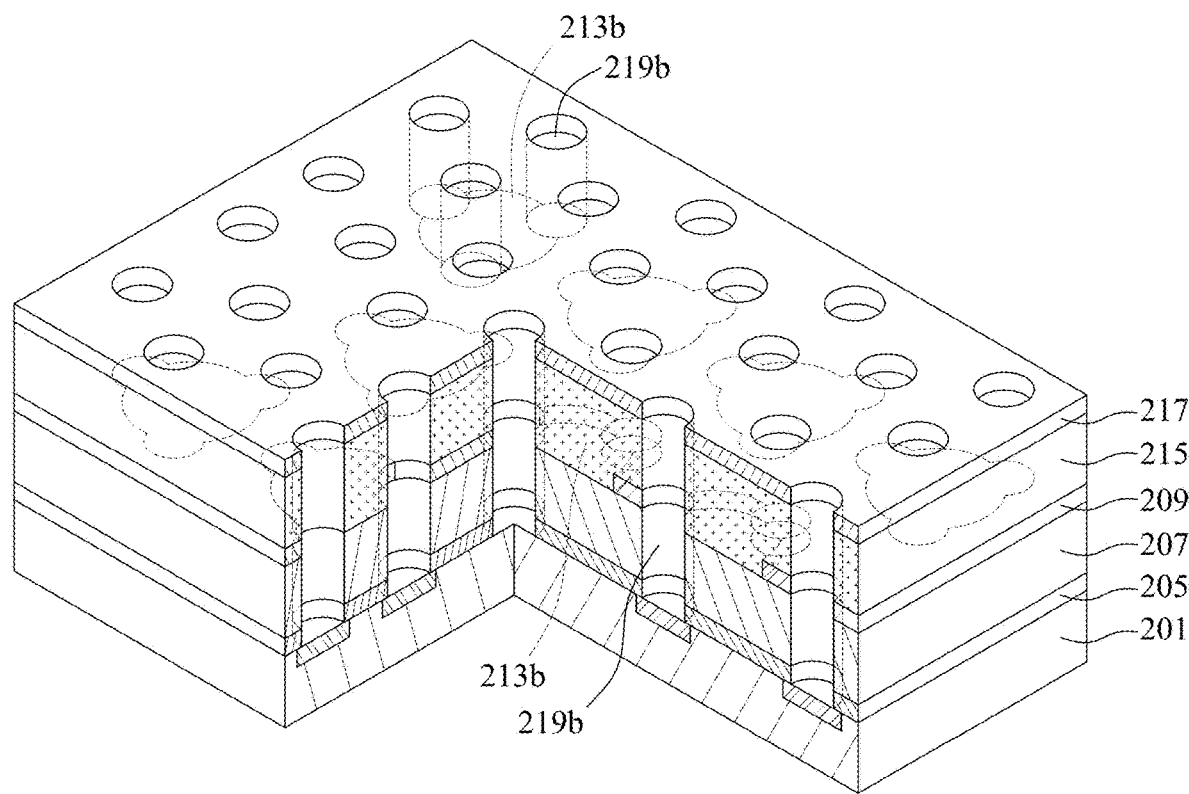
FIG. 6B is a three-dimensional cross-sectional view of the semiconductor substrate according to an embodiment of the present disclosure after the performing of step S109 in FIG. 1 using a second photomask.
Figure 6C:
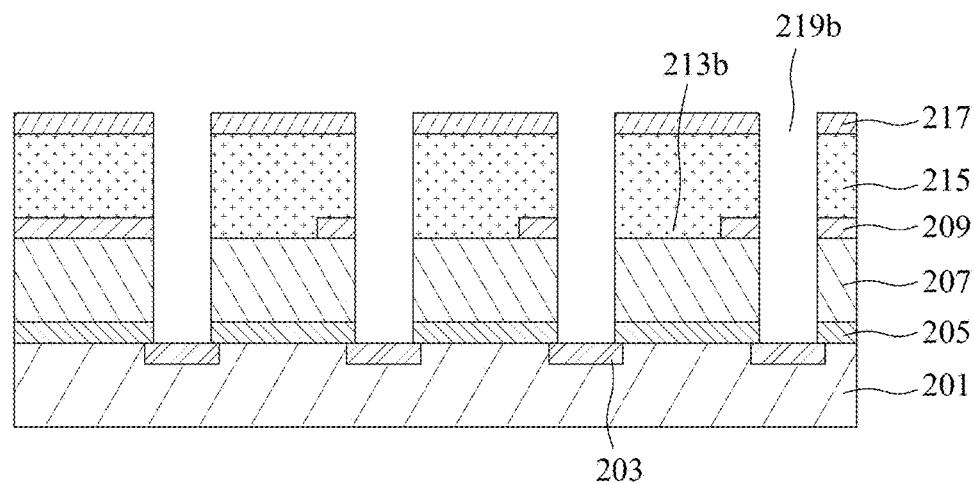
FIG. 6C is a cross-sectional view, taken along line B-B in FIG. 6A, of the semiconductor substrate according to an embodiment of the present disclosure after the performing of step S109 in FIG. 1 using a second photomask.

Referring to FIGS. 1 and 5, in step S107, a second silicon oxide layer 215 and a third silicon nitride layer 217 are sequentially deposited over the second silicon nitride layer 209. The recess 213b in the second silicon nitride layer 209 is also filled with the same material of the second silicon oxide layer 215. A process such as spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof can be used for the performing of step S107.

Referring to FIGS. 1, 6A, 6B, and 6C, in step S109, a second photomask 217 with a via pattern 219a and an anisotropic plasma etching are used to pattern the third silicon nitride layer 217. The anisotropic plasma etching is continued until vias 219b having sidewalls and bottoms are formed in the third silicon nitride layer 217, the second silicon oxide layer 215, the second silicon nitride layer 209, and the first silicon oxide layer 207, thereby revealing the underlying portion of the contact regions 203. According to an embodiment of the present disclosure, step S109 is performed by dry anisotropic etching using a fluorine-containing compound as an etchant. Preferably, the fluorine-containing compound is selected from trifluoromethane, tetrafluoromethane, and sulfur hexafluoride.

Figure 7A:
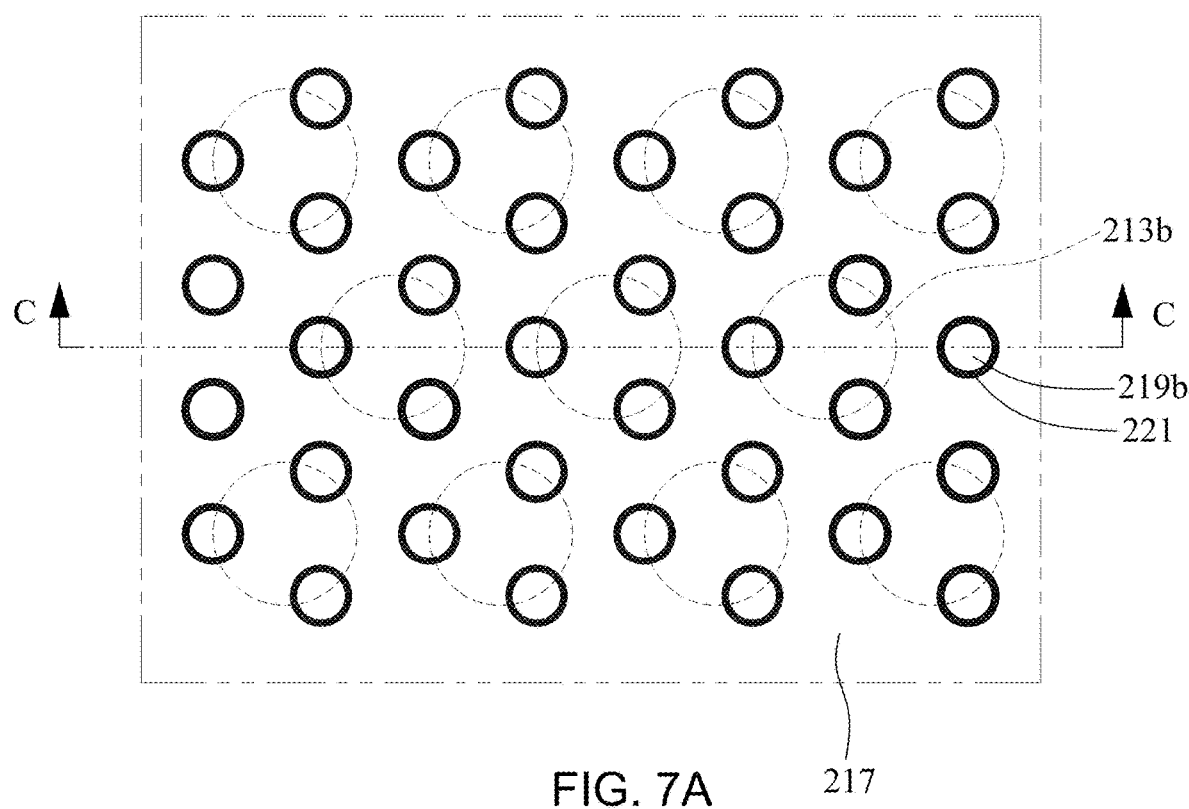
FIG. 7A is a top view showing the semiconductor substrate according to an embodiment of the present disclosure after performing of step S111 in FIG. 1.
Figure 7B:
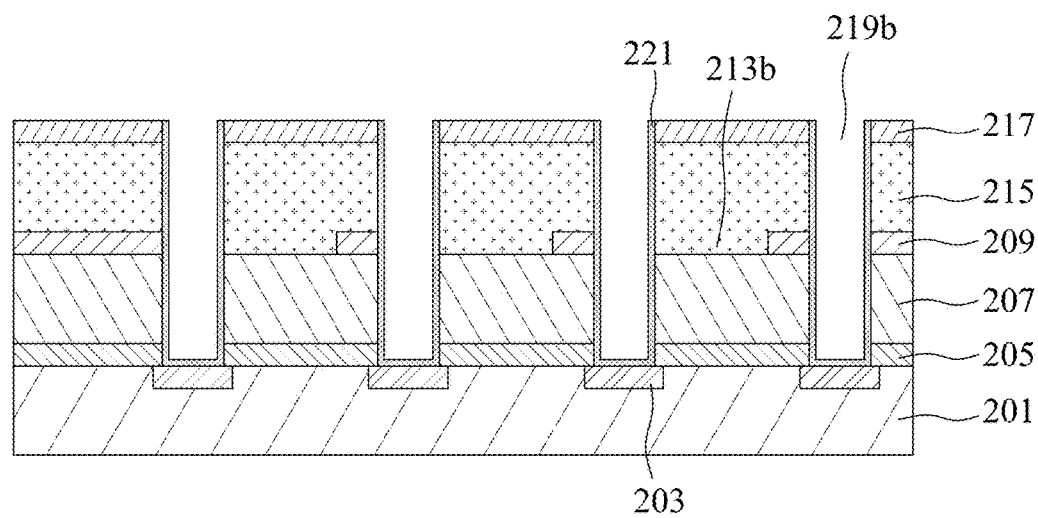
FIG. 7B is a cross-sectional view, taken along line C-C in FIG. 7A, of the semiconductor substrate according to an embodiment of the present disclosure after the performing of step S111 in FIG. 1.

Referring to FIGS. 1, 7A, and 7B, in step S111, the sidewalls and the bottoms of the vias 219b are coated with a first titanium nitride layer 221. A process such as spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof can be used for the performing of step S111.

Figure 8:
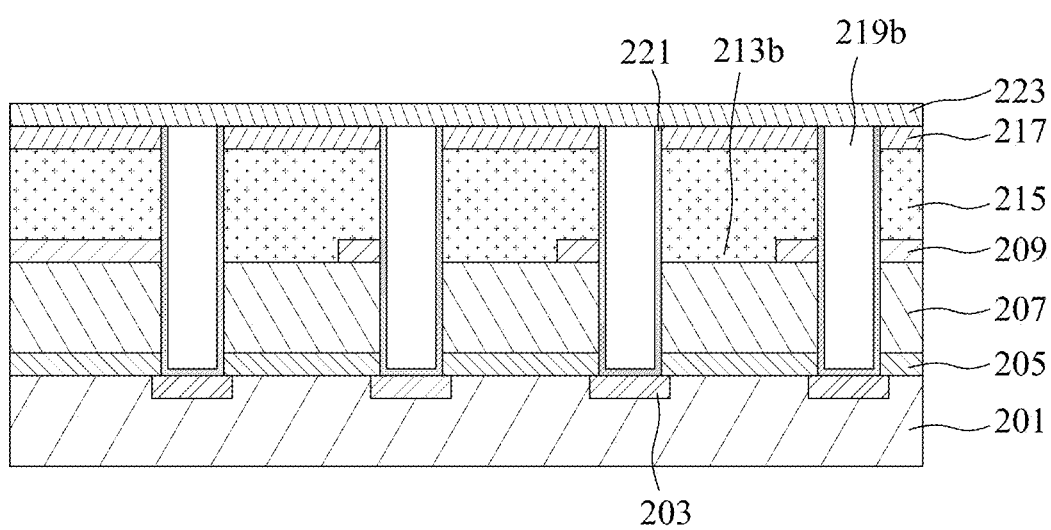
FIG. 8 is a cross-sectional view of the semiconductor substrate according to an embodiment of the present disclosure after the performing of step S113 in FIG. 1.

Referring to FIGS. 1 and 8, in step S113, a hard mask 223 is deposited on the third silicon nitride layer 217, thereby sealing the vias 219b. In a preferred embodiment of the present disclosure, step S113 is preformed by plasma enhanced chemical vapor deposition (PECVD).

Figure 9A:
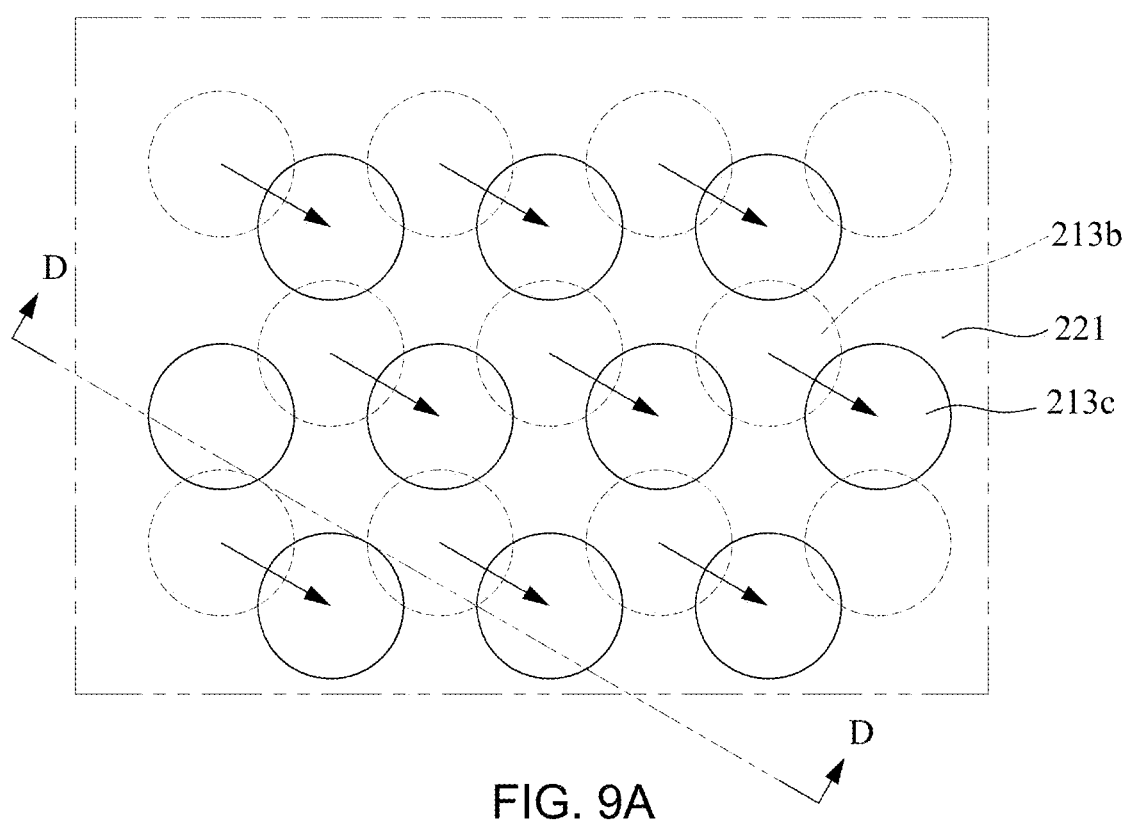
FIG. 9A is a top view showing the semiconductor substrate according to an embodiment of the present disclosure after performing of step S115 in FIG. 1 using the same first photomask.
Figure 9B:
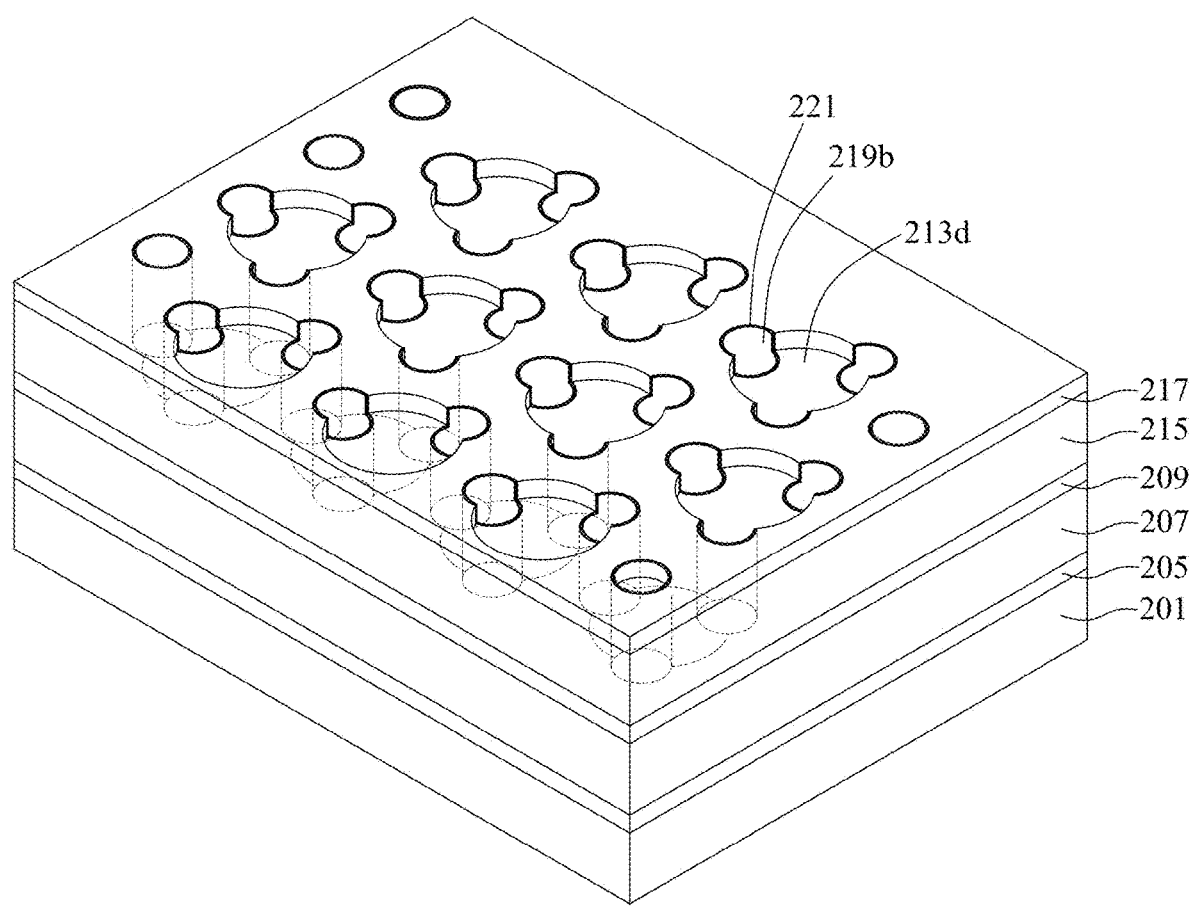
FIG. 9B is a three-dimensional view of the semiconductor substrate according to an embodiment of the present disclosure after the performing of step S115 in FIG. 1 using the same first photomask.

Referring to FIGS. 1, 9A, and 9B, in step S115, the first photomask 209 and an anisotropic plasma etching are used to perform the patterning of the third silicon nitride layer 217 to form a second lattice pattern 213c on the third silicon nitride layer 217, and the etching is continued until the portion of the third silicon nitride layer 217 within the second lattice pattern 213c is removed and the underlying portion of the second silicon oxide layer 215 is revealed. Accordingly, a recess 213d corresponding to the second lattice pattern 213c of the first photomask 209 is formed in the third silicon nitride layer 217. The second lattice pattern 213c is offset from the first lattice pattern 213a at a distance of one or more vias. The vias 219b overlap the periphery of the first lattice pattern 213a and the second lattice pattern 213c.

Figure 10:
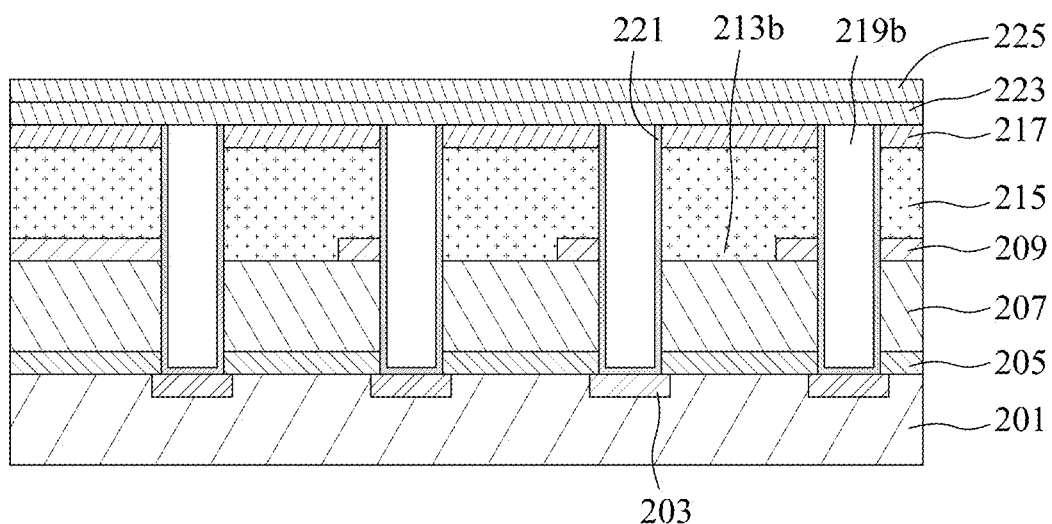
FIG. 10 is a cross-sectional view of the semiconductor substrate according to an embodiment of the present disclosure after the performing of step S117 in FIG. 1.

Referring to FIGS. 1 and 10, in step S117, a high-k dielectric layer 225 is deposited over the third silicon nitride layer 217. A process such as spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof can be used for the performing of step S117.

Figure 11:
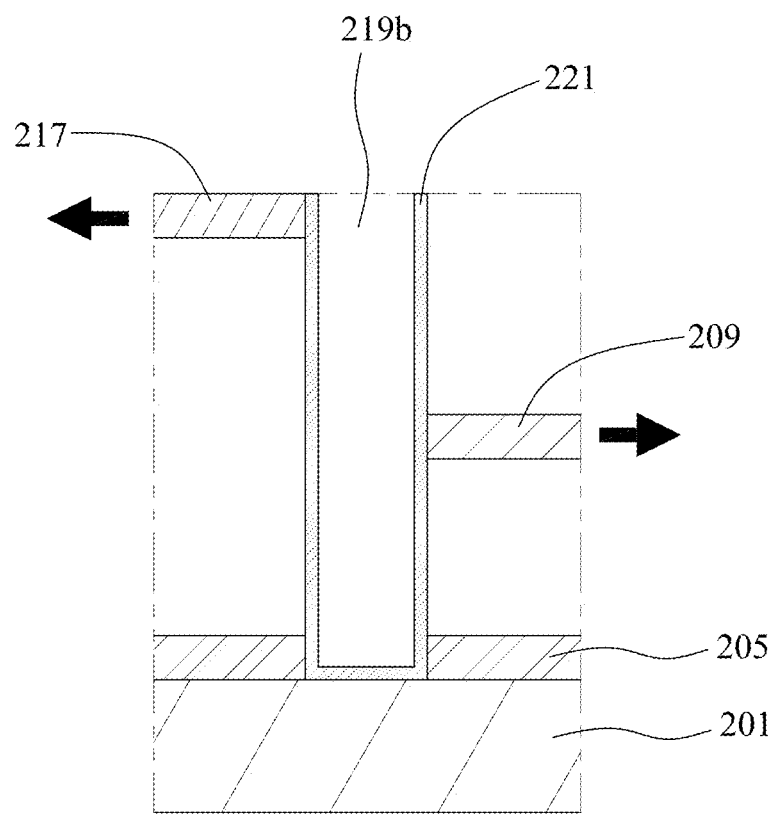
FIG. 11 is an illustrative partial cross-sectional view showing one cylinder-type capacitor bottom electrode of the semiconductor substrate according to an embodiment of the present disclosure after the performing of step S119 in FIG. 1.

Referring to FIGS. 1 and 11, in step S119, the anisotropically etching of the high-k dielectric layer 225 and the third silicon nitride layer 217 is performed by using a hot phosphoric acid solution. As shown in FIG. 11, the lower portion of a cylinder-type capacitor bottom electrode is guided by the first lattice pattern 213a in the second silicon nitride layer 209 (i.e., the middle silicon nitride layer) in one direction, and the upper portion of the same cylinder-type capacitor bottom electrode is guided by the second lattice pattern 213c in the third silicon nitride layer 217 (i.e., the top silicon nitride layer) in an opposite direction. Usually, the first lattice pattern 213a and the second lattice pattern 213c may have an annular shape or a polygonal shape such as a triangle shape or a quadrangle shape. According to an embodiment of the present disclosure, the first lattice pattern 213a and the second lattice pattern 213c have a quadrangle shape selected from a group consisting of a rectangle shape, a trapezoid shape, and a parallelogram shape.

In the present disclosure, by allowing a second lattice pattern on a second silicon nitride layer (i.e., a top silicon nitride layer) to be offset from a first lattice pattern on a first silicon nitride layer (i.e., a middle silicon nitride layer) at a distance of one or more vias, the lower portion of a cylinder-type capacitor bottom electrode is guided by the first lattice pattern in the middle silicon nitride layer on one side, and the upper portion of the same cylinder-type capacitor bottom electrode is guided by the second lattice pattern in the top silicon nitride layer on the other side. Therefore, a collapse or deformation phenomenon of bottom electrodes of stacked capacitors is reduced or eliminated. The wobbling phenomenon of bottom electrodes of stacked capacitors can be significantly reduced.

The scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating DRAM devices with cylinder-type capacitor bottom electrodes, comprising:
providing a semiconductor substrate having a plurality of contact regions;
sequentially depositing a first silicon nitride layer, a first silicon oxide layer, and a second silicon nitride layer on the semiconductor substrate;
patterning the second silicon nitride layer using a first photomask to form a first lattice pattern having a periphery on the second silicon nitride layer, thereby revealing the underlying portion of the first silicon oxide layer;
sequentially depositing a second silicon oxide layer and a third silicon nitride layer on the second silicon nitride layer;
forming a plurality of vias having sidewalls and bottoms vertically through the third silicon nitride layer, the second silicon oxide layer, the second silicon nitride layer, the first silicon oxide layer, and the first silicon nitride layer using a second photomask, thereby revealing the underlying portion of the contact regions, wherein the vias overlap the periphery of the first lattice pattern;
coating the sidewalls and the bottoms of the vias with a first titanium nitride layer;
depositing a hard mask on the third silicon nitride layer, thereby sealing the vias;
forming a second lattice pattern having a periphery on the hard mask using the first photomask, thereby revealing the underlying portion of the second silicon oxide layer, wherein the second lattice pattern is offset from the first lattice pattern at a distance of one or more vias, and wherein the vias overlap the periphery of the first lattice pattern and the second lattice pattern;
depositing a high-k dielectric layer over the third silicon nitride layer; and
anisotropically etching the high-k dielectric layer and the third silicon nitride layer until the underlying portion of the second silicon oxide layer is revealed, and continuing said etching until both of the first silicon oxide layer and the second silicon oxide layer are removed.

2. The method according to claim 1, wherein the step of sequentially depositing a first silicon nitride layer, a first silicon oxide layer and a second silicon nitride layer on the semiconductor substrate is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), or plasma enhanced chemical vapor deposition (PECVD), or a combination thereof.

3. The method according to claim 1, wherein the step of patterning the second silicon nitride layer using a first photomask to form a first lattice pattern having a periphery on the second silicon nitride layer is performed by anisotropic plasma etching.

4. The method according to claim 1, wherein the step of sequentially depositing a second silicon oxide layer and a third silicon nitride layer on the second silicon nitride layer is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof.

5. The method according to claim 1, wherein the step of forming a plurality of vias having sidewalls and bottoms vertically through the third silicon nitride layer, the second silicon oxide layer, the second silicon nitride layer, the first silicon oxide layer, and the first silicon nitride layer using a second photomask is performed by dry anisotropic etching using a fluorine-containing compound as an etchant.

6. The method according to claim 5, wherein the fluorine-containing compound is selected from a group consisting of trifluoromethane, tetrafluoromethane, and sulfur hexafluoride.

7. The method according to claim 1, wherein the step of coating the sidewalls and the bottoms of the vias with a first titanium nitride layer is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof.

8. The method according to claim 1, wherein the step of depositing a hard mask on the third silicon nitride layer is performed by plasma enhanced chemical vapor deposition (PECVD).

9. The method according to claim 1, wherein the step of forming a second lattice pattern having a periphery on the hard mask using the first photomask is performed by anisotropic plasma etching.

10. The method according to claim 1, wherein the step of depositing a high-k dielectric layer over the third silicon nitride layer is performed by spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma enhanced chemical vapor deposition (PECVD), or a combination thereof.

11. The method according to claim 1, wherein the step of anisotropically etching the high-k dielectric layer and the third silicon nitride layer until the underlying portion of the second silicon oxide layer is performed by using a hot phosphoric acid solution.

12. The method according to claim 1, wherein the first lattice pattern and the second lattice pattern have an annular shape or a polygonal shape.

13. The method according to claim 12, wherein the first lattice pattern and the second lattice pattern have a polygonal shape selected from a triangle shape and a quadrangle shape.

14. The method according to claim 13, wherein the first lattice pattern and the second lattice pattern have a quadrangle shape selected from a group consisting of a rectangle shape, a trapezoid shape, and a parallelogram shape.

* * * * *